US010585400B2

(12) United States Patent
Drader

(10) Patent No.: US 10,585,400 B2
(45) Date of Patent: Mar. 10, 2020

(54) METHOD OF OPERATING A TIME-TO-DIGITAL CONVERTER AND TIME-TO-DIGITAL CONVERTER CIRCUIT

(71) Applicant: ams AG, Premstaetten (AT)

(72) Inventor: Marc Drader, Colombelles (FR)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/095,022

(22) PCT Filed: Apr. 24, 2017

(86) PCT No.: PCT/EP2017/059643
§ 371 (c)(1),
(2) Date: Oct. 19, 2018

(87) PCT Pub. No.: WO2017/186632
PCT Pub. Date: Nov. 2, 2017

(65) Prior Publication Data

US 2019/0155223 A1 May 23, 2019

(30) Foreign Application Priority Data

Apr. 25, 2016 (EP) .................................... 16166908

(51) Int. Cl.
*H03M 1/50* (2006.01)
*G04F 10/00* (2006.01)

(52) U.S. Cl.
CPC .................................. *G04F 10/005* (2013.01)

(58) Field of Classification Search
CPC .......... G04F 10/005; H03M 1/50; H03M 1/60
USPC ......................................... 341/155, 122, 166
See application file for complete search history.

(56) References Cited

U.S. PATENT DOCUMENTS

| | | | | |
|---|---|---|---|---|
| 10,056,974 B2 * | 8/2018 | Sanguinetti | H04B 10/071 | |
| 2003/0076251 A1 * | 4/2003 | Gupta | G04F 10/005 | 341/133 |
| 2009/0091486 A1 * | 4/2009 | Wiesbauer | G04F 10/005 | 341/143 |
| 2012/0044102 A1 * | 2/2012 | Henzler | G04F 10/005 | 341/120 |

(Continued)

FOREIGN PATENT DOCUMENTS

| | | |
|---|---|---|
| CA | 2562200 | 3/2008 |
| WO | 2016/035469 | 3/2016 |

OTHER PUBLICATIONS

European Patent Office, International Search Report for PCT/EP2017/059643, dated Jul. 10, 2017.

*Primary Examiner* — Peguy Jean Pierre
(74) *Attorney, Agent, or Firm* — Fish & Richardson P.C.

(57) ABSTRACT

The method comprises providing a time-to-digital converter with a measurement period (3) for registration of events (1), and selecting time intervals of independent durations (4), each of the durations being independent of the registration of events. At each registration of an event, the time-to-digital converter is blocked from further registration for one of the time intervals of independent duration. Thus the recorded lengths of the time intervals (11, 13, 14, 16) corresponding to the occurrence of the events within each measurement period are uniformly distributed and a time-domain bias is avoided. The time-to-digital converter circuit includes a controlled gate for blocking the time-to-digital converter.

10 Claims, 3 Drawing Sheets

FIG 5

(56) References Cited

U.S. PATENT DOCUMENTS

| | | | |
|---|---|---|---|
| 2014/0054455 | A1 | 2/2014 | Suarez et al. |
| 2015/0268633 | A1 | 9/2015 | Chou et al. |

* cited by examiner

METHOD OF OPERATING A TIME-TO-DIGITAL CONVERTER AND TIME-TO-DIGITAL CONVERTER CIRCUIT

BACKGROUND OF THE INVENTION

Time-to-digital converters (TDCs) are used to measure time intervals and convert them into digital output signals. A single-photon avalanche diode (SPAD, also known as Geiger-mode avalanche photodiode) is a photodetector in which a photon-generated carrier triggers an avalanche current.

CA 2 562 200 A1 discloses a time-to-digital converter comprising digital delay circuits. A clock compensation scheme is used to modify and adjust the operation of the TDC. A digital processing algorithm produces one conversion every clock cycle. The time-to-digital converter is intended for high speed circuit applications such as time-based analog-to-digital converters for conversion of radio frequency signals in wireless communication systems and high speed signal measurement applications.

WO 2016/035469 A1 discloses a time measurement device calculating the time between first and second trigger signals. It is provided with start and stop gates for generating a start signal and a stop signal, a TDC circuit for generating a digital code corresponding to the time between the input of the start signal and the input of the stop signal, a delay circuit for delaying the input of the start signal and/or the stop signal to the TDC circuit by a prescribed delay time, and a control unit for calculating a measurement time on the basis of a plurality of digital codes generated by the TDC circuit.

TDCs are typically reset according to fixed measurement periods of constant duration. Thus a TDC either measures the time interval from the beginning of one of the fixed periods, which is used as a start-signal, to the input of a stop signal caused by a triggering event, or the time interval from the input of a start signal caused by a triggering event to the subsequent end of the fixed period. Either way, there can only be one start and one stop signal within each of the measurement periods. Once an event is latched, no further events can be recorded by the TDC until it is reset at the beginning of the next period. Therefore the TDC latches the first event within each period, and subsequent events occurring in the same period are ignored. When the frequency of events is high and there is a large probability that more than one event occurs within a measurement period, the number of recorded events decreases in relation to the time elapsed since the beginning of the period in which the event occurs.

Therefore, the record of events in the time-domain shows a distinct bias, even if the events are uncorrelated like ambient noise evenly spread in time. A histogram of the number of events as a function of the time elapsed since the latest reset of the TDC will have a generally sloping shape. If only one single-photon avalanche diode (SPAD) generating the triggering events is connected to a single TDC, the relatively long deadtime of the SPAD may essentially increase the possibility that an event is missed. If a plurality of SPADs are connected to a TDC in order to extend the sensing area when the frequency of events is low, an increase of that frequency will drastically increase the probability that one of the SPADs triggers the TDC and many subsequent events generated by the other SPADs will be missed.

SUMMARY OF THE INVENTION

The problem of removing the time-domain bias is solved by resetting the input stage of the TDC in an asynchronous manner by means of a delay line, so that the probability of an event being latched by the TDC is uniformly distributed over the measurement periods and the bias vanishes. The occurrence of the first event within a measurement period is used as a start signal to gate or block the input stage of the TDC for a time interval of independent duration, which does not depend on the time of registration of the event but is selected in advance for the entire measurement. The duration of this time interval may ideally be the same for each registration of an event. In practice variations of the duration will not be prevented, and it is therefore appropriate to specify durations of time intervals of independent durations only for a selected range or approximate target value. Such a specification allows for some jitter or statistical distribution, which is characteristic of time intervals generated by electronic circuits.

The lengths of the time intervals of independent durations may be equal or at least approximately equal to the length of each measurement period, or they may be slightly greater, so that the input will be blocked in each case at least until the end of the period is reached, even if the triggering event is registered immediately after the beginning of the period. It may be favorable to avoid blocking the input during a larger time interval, which would unduly restrict the overall availability of the TDC. If the frequency of events is very high, it is probable that the next event to be registered occurs immediately after the time interval of independent duration elapses. In this case, a uniform distribution of the recorded times may be obtained if the length of any of the time intervals of independent durations and the length of each measurement period are not in a ratio of integers and/or the durations vary randomly, which is practically always the case.

The method of operating a time-to-digital converter comprises providing a time-to-digital converter with a measurement period for registration of events, selecting time intervals of independent durations, each of the durations being independent of the registration of events, and, at each registration of an event, blocking the time-to-digital converter from registration for one of the time intervals of independent durations. In particular, each of the durations of the time intervals of independent durations may be within a selected range or at least approximately equal to a selected target value.

In a variant of the method, the durations of the time intervals of independent durations are longer than the duration of one of the measurement periods and/or shorter than twice the duration of one of the measurement periods. In a further variant, the durations of the time intervals of independent durations may be greater than half a selected target value and smaller than one and a half of that target value. The target value may especially be larger than the duration of one of the measurement periods.

In a further variant of the method, the time-to-digital converter is blocked by gating an input stage.

A further variant of the method comprises recording lengths of sample time intervals, each of the sample time intervals lasting from the beginning of one of the measurement periods to the registration of an event within this measurement period.

The time-to-digital converter circuit comprises a time-to-digital converter, an input stage and a gate between the input stage and the time-to-digital converter. A gating logic and delay line component may be provided, which controls the gate and is controlled by the time-to-digital converter.

A logical OR member may be provided between the input stage and the gate to allow input from a plurality of sources of events.

The method of operating a time-to-digital converter and the time-to-digital converter circuit will be described in more detail with reference to the accompanying figures.

DETAILED DESCRIPTION

Figure 1:
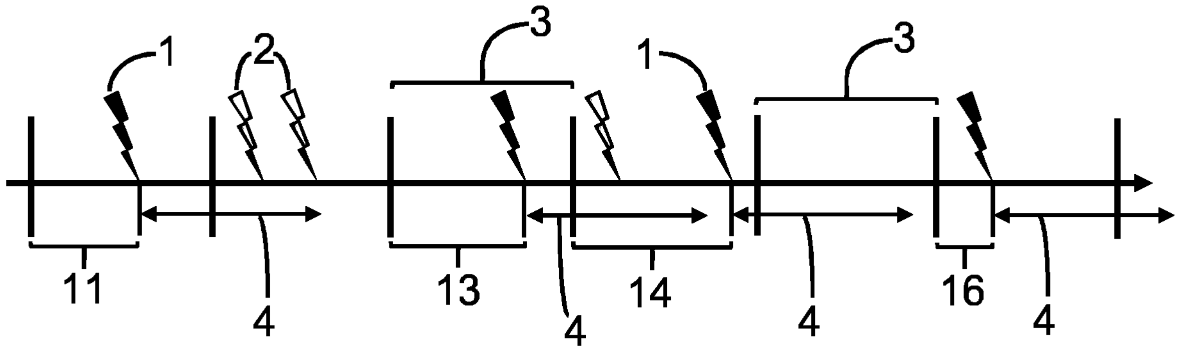
FIG. 1 is a time line diagram illustrating the method.

FIG. 1 is a time line diagram representing the course of time indicated by the arrow pointing from left to right. Statistically distributed occurrences of a few registered events 1 and a few missed events 2 are shown by way of example. The time line is divided into equal measurement periods 3 of the time-to-digital converter. A time interval of independent duration 4 is selected to provide an asynchronous reset of the TDC. When a triggering event 1 is registered, the TDC is blocked for the time interval of independent duration 4. The duration of this time interval may ideally be selected in advance to be the same for each registration of an event, but in practice some variations of the selected duration cannot be avoided. Hence the time interval of independent duration 4 is specified within a certain range, which may be limited from below by the length of the measurement period 3.

Sample time intervals 11, 13, 14, 16 indicated in FIG. 1 each elapse from the beginning of the measurement period 3 in which the event 1 is registered to the time of the occurrence of the event 1. The registered event 1 blocks the TDC, so that during the subsequent time interval of independent duration 4 no further registration of events is possible. A few missed events 2 are shown in FIG. 1 by way of example.

In the example shown in FIG. 1, the time interval of independent duration 4 has approximately the same duration as one measurement period 3. The time interval of independent duration 4 may instead be longer than one measurement period 3, typically only slightly longer than one measurement period 3.

The lengths of the sample time intervals 11, 13, 14, 16 are uniformly distributed between zero and the whole measurement period 3. Missed events 2 occur during each time interval of independent duration 4, when the TDC is blocked. The sample time intervals 11, 13, 14, 16 do not show a bias, since the probability for events 1 to be registered does not vary between two subsequent time limits defining the beginning and end of a measurement period 3.

Figure 2:
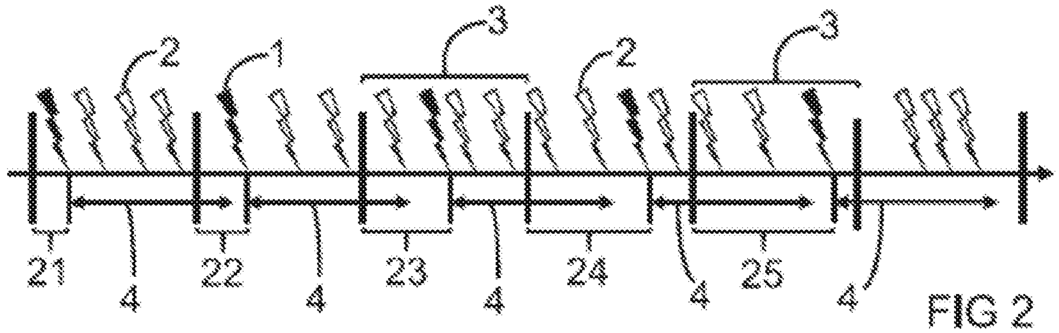
FIG. 2 is a further time line diagram illustrating the method.

FIG. 2 is a further time line diagram according to FIG. 1. A few registered events 1 and a few missed events 2 are shown in FIG. 2 for an example of a higher frequency of events. The lengths of the sample time intervals 21, 22, 23, 24, 25 are still uniformly distributed between zero and the whole measurement period 3. Merely the relative number of missed events 2 is increased as compared to the example shown in FIG. 1.

The relative number of missed events 2 is further increased if a longer time interval of independent duration 4 is selected, and hence it may be favorable to select a short time interval. If the time interval of independent duration 4 is not shorter than one measurement period 3, the blocking of the TDC caused by an event registered at the very beginning of a measurement period 3 lasts at least until the end of that measurement period 3, in order to ensure that at most one event is registered within each measurement period 3.

Figure 3:
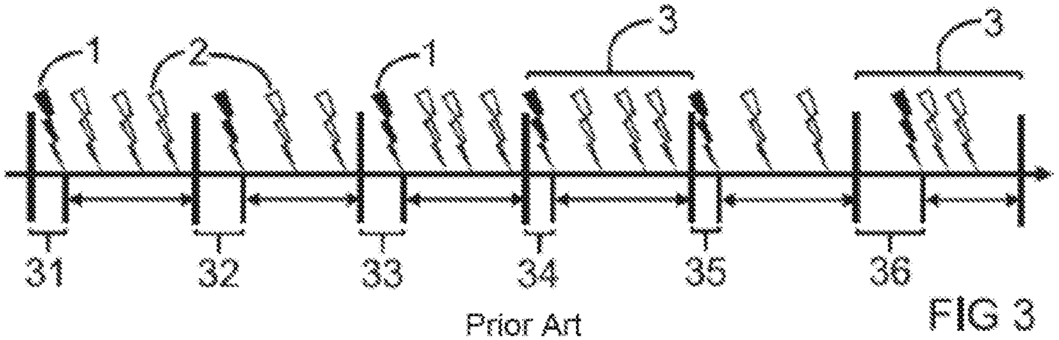
Prior Art FIG 3
FIG. 3 is a time line diagram illustrating the conventional operation of a TDC at high frequency of events.

FIG. 3 is a time line diagram illustrating the conventional operation of a TDC at a high frequency of events as in the example according to FIG. 2. Some of the registered events 1 of FIG. 2 are missed events 2 in FIG. 3, and some of the missed events 2 of FIG. 2 are registered events 1 in FIG. 3. However, FIG. 3 shows the striking feature that all the sample time intervals 31, 32, 33, 34, 35, 36 are relatively short, in particular shorter than one half of the duration of one measurement period 3. The distribution of registered events 1 exhibits a distinct bias towards shorter sample time intervals.

Figure 4:
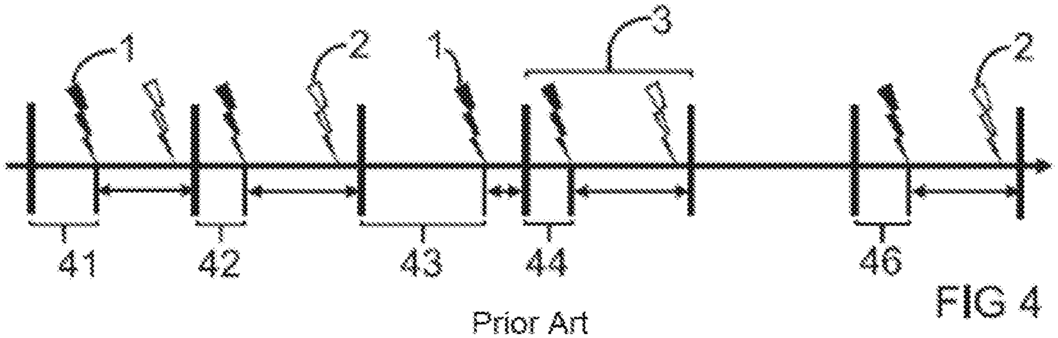
Prior Art FIG 4
FIG. 4 is a further time line diagram illustrating the conventional operation of a TDC at lower frequency.

FIG. 4 is a further time line diagram illustrating the conventional operation of a TDC at lower frequency. In this example as well, the sample time intervals 41, 42, 43, 44, 46 are relatively short, except for the sample time interval 43. The larger sample time interval 43 is due to the fact that only one event occurs in the relevant measurement period 3 and this event is registered near the end of the measurement period 3. Although the improvement obtained by blocking the TDC for time intervals of independent duration 4 may be especially important when the frequency of events is high, FIG. 4 shows that the problem of a time-domain bias may also arise in lower-frequency applications.

Figure 5:
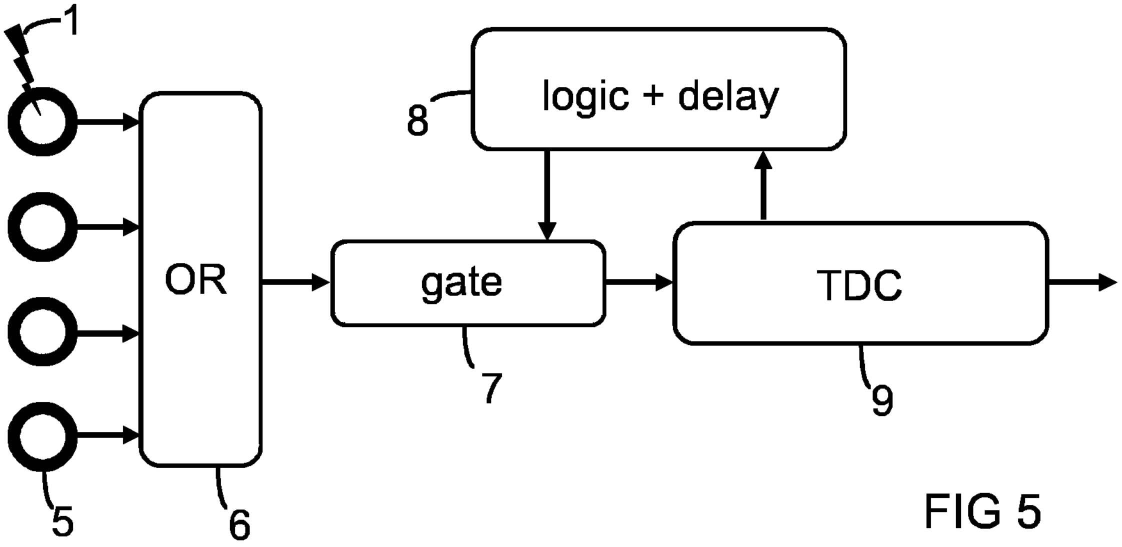
FIG. 5 is a diagram of a time-to-digital converter circuit.

FIG. 5 is a diagram of a time-to-digital converter circuit, which may be used in the method. The circuit comprises an input stage 5, which may additionally be provided with a logical OR member 6 to allow multiple input, a gate 7, optionally a gating logic and delay line component 8 controlling the gate 7, and the time-to-digital converter 9, which may directly control the gate 7 or instead provide a corresponding input to the gating logic and delay line component 8. The gate 7 allows to block the input stage 5 at the time of registration of a triggering event and to maintain the blocking for the duration of the preselected time interval of independent duration 4. Any delay-element technique known per se can be used to block the input of the TDC on the occurrence of a triggering event for a time interval of independent duration 4, which is optionally selected to be equal to or greater than the measurement period 3.

Figure 6:
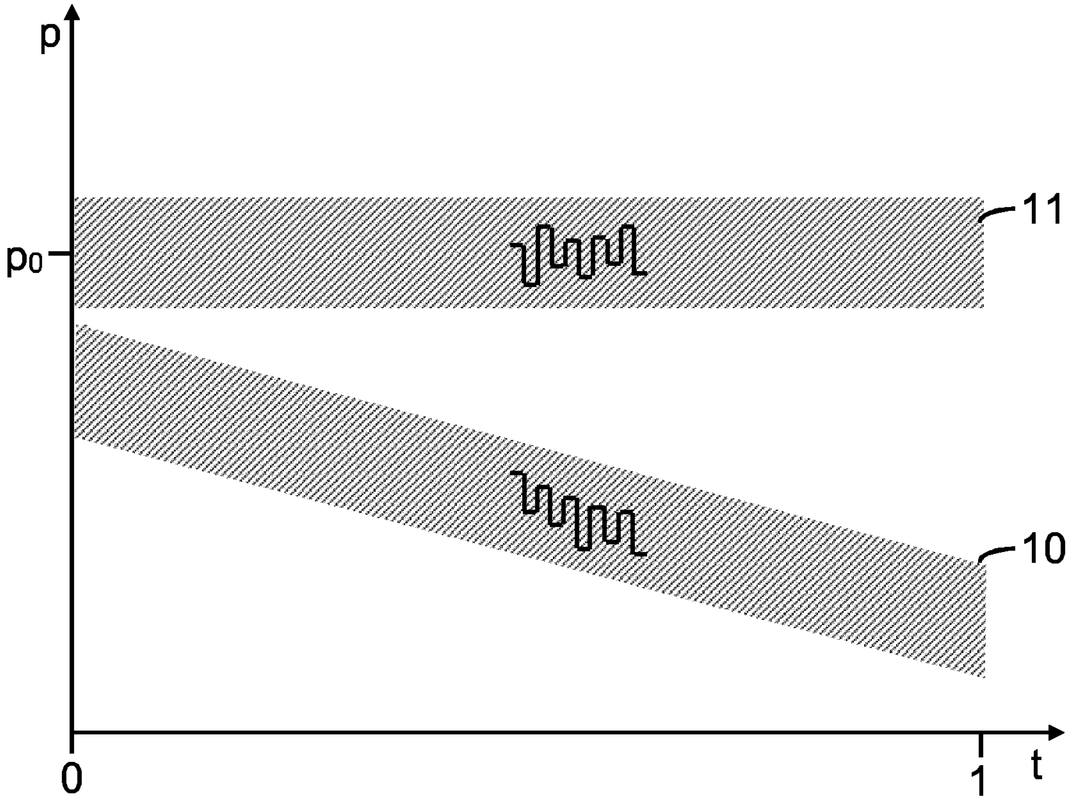
FIG. 6 is a diagram showing shapes of histograms.

FIG. 6 is a diagram showing shapes of histograms that may be obtained from the digital values corresponding to the sample time intervals that are associated with the registered events 1. The unit t of the abscissa or x-axis is the total duration of one measurement period 3. The unit p of the ordinate or y-axis is the probability represented by the number of cases in each bin, which may especially be the number of sample time intervals lying within a defined range. The histograms 10, 11 are only schematically indicated and the general outlines of their shapes are illustrated by the hatched areas. The sloping histogram 10 typically results from the conventional operation of a TDC, whereas the flat histogram 11 is obtained with the method described above. The flat histogram 11 shows a distribution about an average probability $p_0$ of a uniform distribution.

The described method allows to enhance TDC measurements for applications under extreme conditions, including exposure to sunlight of typically 110000 1×, for instance.

The invention claimed is:

1. A method of operating a time-to-digital converter, comprising:

providing a time-to-digital converter with a measurement period for registration of events;

selecting time intervals of independent durations, each of the durations being independent of the registration of events; and at each registration of an event, blocking the time-to-digital converter for one of the time intervals of independent durations, wherein a target value is selected, and the durations of the time intervals of independent durations are greater than half the target value and smaller than one and a half the target value.

2. The method of claim 1, further comprising:

selecting a range or a target value, each of the durations of the time intervals of independent durations being within the range or at least approximately equal to the target value.

3. The method of claim 1 or 2, wherein the durations of the time intervals of independent durations are longer than the duration of the measurement period.

4. The method of claim 1 or 2, wherein the durations of the time intervals of independent durations are shorter than twice the duration of the measurement period.

5. The method of claim 1 or 2, wherein the time-to-digital converter is blocked by gating an input stage.

6. The method of claim 1 or 2, further comprising:

recording lengths of sample time intervals, each of the sample time intervals lasting from the beginning of one of the measurement periods to the registration of an event within this measurement period.

7. A time-to-digital converter circuit, comprising:

a time-to-digital converter;

an input stage; and a gate between the input stage and the time-to-digital converter, wherein the gate is configured to block the input stage at a time of registration of a triggering event and to maintain the blocking for a duration of a preselected time interval of independent duration.

8. The time-to-digital converter circuit of claim 7, further comprising:

a gating logic and delay line component, which controls the gate and is controlled by the time-to-digital converter.

9. The time-to-digital converter circuit of claim 7, further comprising:

a logical OR member between the input stage and the gate, the logical OR member allowing input from a plurality of sources of events.

10. A method of operating a time-to-digital converter, comprising:

providing a time-to-digital converter with a measurement period for registration of events;

selecting time intervals of independent durations, each of the durations being independent of the registration of events;

at each registration of an event, blocking the time-to-digital converter for one of the time intervals of independent durations;

after blocking, asynchronously resetting the time-to-digital converter with respect to the measurement period; and recording lengths of sample time intervals, each of the sample time intervals lasting from the beginning of one of the measurement periods to the registration of an event within this measurement period.

* * * * *